United States Patent
Watanabe

(10) Patent No.: US 9,076,704 B2
(45) Date of Patent: Jul. 7, 2015

(54) PHOTOELECTRIC CONVERSION APPARATUS AND MANUFACTURING METHOD FOR A PHOTOELECTRIC CONVERSION APPARATUS

(71) Applicant: CANON KABUSHIKI KAISHA, Tokyo (JP)

(72) Inventor: Takanori Watanabe, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/040,032

(22) Filed: Sep. 27, 2013

(65) Prior Publication Data

US 2014/0091416 A1 Apr. 3, 2014

Related U.S. Application Data

(62) Division of application No. 13/132,968, filed as application No. PCT/JP2010/051309 on Jan. 26, 2010, now Pat. No. 8,570,418.

(30) Foreign Application Priority Data

Feb. 6, 2009 (JP) ................................ 2009-026696
Jan. 20, 2010 (JP) ................................ 2010-010370

(51) Int. Cl.
H01L 27/146 (2006.01)
(52) U.S. Cl.
CPC ...... *H01L 27/1463* (2013.01); *H01L 27/14689* (2013.01); *H01L 27/1464* (2013.01)
(58) Field of Classification Search
USPC ........................................... 257/446; 438/79
See application file for complete search history.

(56) References Cited

U.S. PATENT DOCUMENTS

| | | | | |
|---|---|---|---|---|
| 6,281,531 B1 | 8/2001 | Kamashita et al. | ........... | 257/258 |
| 6,423,993 B1 | 7/2002 | Suzuki et al. | ................ | 257/292 |
| 6,731,337 B2 | 5/2004 | Watanabe | ...................... | 348/308 |
| 6,885,047 B2 | 4/2005 | Shinohara et al. | ............ | 257/292 |
| 7,323,731 B2 | 1/2008 | Yuzurihara et al. | ........... | 257/292 |

(Continued)

FOREIGN PATENT DOCUMENTS

| | | |
|---|---|---|
| CN | 1471311 A | 1/2004 |
| CN | 1627524 A | 6/2005 |

(Continued)

*Primary Examiner* — Albert Cutler
(74) *Attorney, Agent, or Firm* — Fitzpatrick, Cella, Harper & Scinto

(57) ABSTRACT

A photoelectric conversion apparatus has multiple photoelectric converting units disposed in a semiconductor substrate, and isolation portions disposed in the semiconductor substrate. Each photoelectric converting unit includes a second semiconductor region, a third semiconductor region, disposed below the second semiconductor region and a fourth semiconductor region disposed below the third semiconductor region. Each isolation portion includes a fifth semiconductor region, placed deeper than the surface of the semiconductor substrate and at least extending laterally to the second semiconductor region, containing a first conductivity type impurity, and a sixth semiconductor region, below the fifth semiconductor region and at least extending laterally to the third semiconductor region, containing the first conductivity type impurity, and the diffusion coefficient of the impurity contained in the fifth semiconductor region is lower than the diffusion coefficient of the impurity contained in the sixth semiconductor region.

6 Claims, 6 Drawing Sheets

(56) References Cited

U.S. PATENT DOCUMENTS

| | | | |
|---|---|---|---|
| 7,411,170 B2 | 8/2008 | Shimotsusa et al. | 250/208.1 |
| 7,423,305 B2 | 9/2008 | Shinohara et al. | |
| 7,456,880 B2 | 11/2008 | Okita et al. | 348/243 |
| 7,459,735 B2 | 12/2008 | Ezaki et al. | 257/292 |
| 7,514,732 B2 | 4/2009 | Okita et al. | 257/292 |
| 7,687,299 B2 | 3/2010 | Ichikawa | 438/57 |
| 7,705,381 B2 | 4/2010 | Shinohara et al. | |
| 7,723,766 B2 | 5/2010 | Shinohara et al. | |
| 7,732,246 B2 | 6/2010 | Lee | 438/74 |
| 7,776,643 B2 | 8/2010 | Nomura et al. | 438/79 |
| 7,842,987 B2 | 11/2010 | Mabuchi | |
| 7,920,192 B2 | 4/2011 | Watanabe et al. | 348/308 |
| 7,928,477 B2 | 4/2011 | Kobayashi et al. | 257/225 |
| 7,935,557 B2 | 5/2011 | Mishima et al. | 438/60 |
| 8,436,406 B2 | 5/2013 | Shinohara et al. | |
| 8,541,255 B2 | 9/2013 | Mabuchi | |
| 8,580,595 B2 | 11/2013 | Shinohara et al. | |
| 2002/0050593 A1 | 5/2002 | Fukunaga et al. | 257/53 |
| 2004/0188722 A1 | 9/2004 | Izumi et al. | 257/215 |
| 2004/0262494 A1* | 12/2004 | Egawa et al. | 250/208.1 |
| 2005/0035382 A1 | 2/2005 | Shinohara et al. | 257/290 |
| 2005/0269604 A1 | 12/2005 | Koizumi et al. | 257/291 |
| 2006/0043519 A1 | 3/2006 | Ezaki | 257/461 |
| 2006/0138531 A1 | 6/2006 | Lee | 257/327 |
| 2007/0281472 A1 | 12/2007 | Press et al. | 438/664 |
| 2008/0038865 A1 | 2/2008 | Kwon | 438/73 |
| 2008/0296629 A1 | 12/2008 | Mabuchi | 257/233 |
| 2009/0050997 A1 | 2/2009 | Mutoh | 257/440 |
| 2009/0209056 A1* | 8/2009 | Hiyama et al. | 438/57 |
| 2009/0256230 A1 | 10/2009 | Watanabe | 257/435 |
| 2009/0284632 A1 | 11/2009 | Onuki et al. | 348/302 |
| 2010/0116971 A1* | 5/2010 | McCarten et al. | 250/214.1 |
| 2010/0187581 A1 | 7/2010 | Shinohara et al. | 257/292 |
| 2010/0203667 A1 | 8/2010 | Hirota et al. | 438/72 |
| 2010/0203670 A1 | 8/2010 | Ohtani et al. | 438/98 |
| 2010/0214464 A1 | 8/2010 | Watanabe | 348/311 |
| 2011/0032379 A1 | 2/2011 | Kobayashi et al. | 348/222.1 |
| 2011/0136291 A1 | 6/2011 | Iwata et al. | 438/73 |
| 2011/0157447 A1 | 6/2011 | Watanabe et al. | 348/308 |
| 2011/0171770 A1 | 7/2011 | Mishima et al. | 438/60 |
| 2011/0234868 A1 | 9/2011 | Yamashita et al. | 348/294 |
| 2013/0203208 A1 | 8/2013 | Shinohara et al. | |
| 2013/0264619 A1 | 10/2013 | Mabuchi | |
| 2014/0008703 A1 | 1/2014 | Mabuchi | |

FOREIGN PATENT DOCUMENTS

| | | |
|---|---|---|
| CN | 1758442 A | 4/2006 |
| CN | 1815744 A | 8/2006 |
| CN | 1819236 A | 8/2006 |
| CN | 101312205 A | 11/2008 |
| CN | 101359675 A | 2/2009 |
| EP | 1 542 286 A2 | 6/2005 |
| EP | 1 708 267 A1 | 10/2006 |
| EP | 1 995 783 A2 | 11/2008 |
| JP | 11-126893 A | 5/1999 |
| JP | 2001-257339 A | 9/2001 |
| JP | 2003-258223 A | 9/2003 |
| JP | 2004-193547 A | 7/2004 |
| JP | 2005-072236 A | 3/2005 |
| JP | 2005-136269 A | 5/2005 |
| JP | 2005-197674 | 7/2005 |
| JP | 2006-024907 A | 1/2006 |
| JP | 2006-073609 A | 3/2006 |
| JP | 2008-060356 A | 3/2008 |
| JP | 2008-300446 A | 12/2008 |
| WO | WO 2005/109512 A1 | 11/2005 |

\* cited by examiner

PHOTOELECTRIC CONVERSION APPARATUS AND MANUFACTURING METHOD FOR A PHOTOELECTRIC CONVERSION APPARATUS

CROSS REFERENCE TO RELATED APPLICATIONS

This application is a divisional of U.S. application Ser. No. 13/132,968, filed on Jun. 6, 2011, which is a 371 national stage of International Application No. PCT/JP2010/051309, filed on Jan. 26, 2010, the entire disclosures of which are hereby incorporated by reference herein. This application also claims foreign priority under 35 U.S.C. §119 of Japanese Application No. 2009-026696, filed on Feb. 6, 2009, and Japanese Application No. 2010-010370, filed on Jan. 20, 2010.

TECHNICAL FIELD

The present invention relates to a photoelectric conversion apparatus and a manufacturing method for a photoelectric conversion apparatus.

BACKGROUND ART

There is demand for pixel miniaturization and pixel sensitivity improvement in photoelectric conversion apparatuses such as CMOS sensors.

With the solid-state imaging apparatus disclosed in Japanese Patent Laid Open No. 2004-193547, a P-type separating layer and a P-type well layer are disposed between an N-type epitaxial layer and an N-type floating diffusion region (FD) in a photodiode. A P-type separating layer and a P-type well layer are also disposed between the N-type epitaxial layer of the photodiode and the N-type epitaxial layer of a photodiode of an adjacent pixel. Therefore, according to Japanese Patent Laid Open No. 2004-193547, electrons produced by the photodiode are stored in the N-type epitaxial layer with certainty due to the various potential barriers surrounding the N-type epitaxial layer, which is described as improving the pixel sensitivity.

Japanese Patent Laid-Open No. 2004-193547 discloses forming a P-type separating layer and a P-type well layer respectively by implanting boron ions in an N-type silicon substrate. As a specific example of the conditions of this process, the P-type separating layer is formed by implanting the substrate with a dose amount of $6\times10^{11}/cm^2$ of boron ions at an energy of 1200 KeV. The P-type well layer, meanwhile, is formed by implanting the substrate with a dose amount of $10^{12}/cm^2$ of boron ions at an energy of 500 KeV.

The boron tends to diffuse if heat treatment is carried out after the formation of the P-type separating layer and P-type well layer, and thus there is the possibility that the volume of the N-type epitaxial region, which serves as the cathode of the photodiode, will drop. This reduces the magnitude of the charge that can be stored in the N-type epitaxial region of the photodiode, resulting in the possibility that a drop in the sensitivity of the photodiode will appear in the pixel. In other words, there is the possibility that, if the distance between adjacent photodiodes (photoelectric converting units) decreases, the sensitivities of the photodiodes (photoelectric converting units) will drop.

DISCLOSURE OF INVENTION

It is an object of the present invention to suppress a drop in the sensitivities of photoelectric converting units when the distance between adjacent photoelectric converting units decreases.

A photoelectric conversion apparatus according to a first aspect of the present invention includes multiple photoelectric converting units disposed in a semiconductor substrate and isolation portions disposed in the semiconductor substrate so as to isolate the multiple photoelectric converting units from one another. Each photoelectric converting unit has a second semiconductor region containing a second conductivity type impurity that is the opposite conductivity type to a first conductivity type; a third semiconductor region, disposed below the second semiconductor region, containing the second conductivity type impurity at a lower concentration than the second semiconductor region; and a fourth semiconductor region, disposed below the third semiconductor region, containing a first conductivity type impurity. Each isolation portion has a fifth semiconductor region, disposed at a location that is deeper than the surface of the semiconductor substrate and at least extending laterally to the second semiconductor region, containing the first conductivity type impurity; and a sixth semiconductor region, disposed below the fifth semiconductor region and at least extending laterally to the third semiconductor region, containing the first conductivity type impurity. The diffusion coefficient of the impurity contained in the fifth semiconductor region is lower than the diffusion coefficient of the impurity contained in the sixth semiconductor region.

An imaging system according to a second aspect of the present invention includes: the photoelectric conversion apparatus according to the first aspect of the present invention; an optical system that forms an image upon an imaging area of the photoelectric conversion apparatus; and a signal processing unit that generates image data by processing a signal output from the photoelectric conversion apparatus.

A manufacturing method for a photoelectric conversion apparatus according to a third aspect of the present invention includes a semiconductor substrate, the method including the steps of: forming element isolation portions in regions in the semiconductor substrate that are to isolate multiple photoelectric converting units from one another; forming a first semiconductor region below the element isolation portions in the semiconductor substrate by implanting a first impurity of a first conductivity type in the semiconductor substrate using, as a mask, a first resist pattern formed so that the element isolation portions are exposed; forming a second semiconductor region below the first semiconductor region in the semiconductor substrate by implanting a second impurity of the first conductivity type in the semiconductor substrate using the first resist pattern as a mask; and forming charge storage regions in the photoelectric converting units between the multiple element isolation portions in the semiconductor substrate by implanting a second conductivity type impurity that is the opposite conductivity type to the first conductivity type in the semiconductor substrate using, as a mask, a second resist pattern formed so that the regions between the multiple element isolation portions are exposed. The diffusion coefficient of the first impurity is lower than the diffusion coefficient of the second impurity.

According to the present invention, a drop in the sensitivities of photoelectric converting units when the distance between adjacent photoelectric converting units decreases can be suppressed.

Further features of the present invention will become apparent from the following description of exemplary embodiments (with reference to the attached drawings).

BEST MODE FOR CARRYING OUT THE INVENTION

Figure 1:
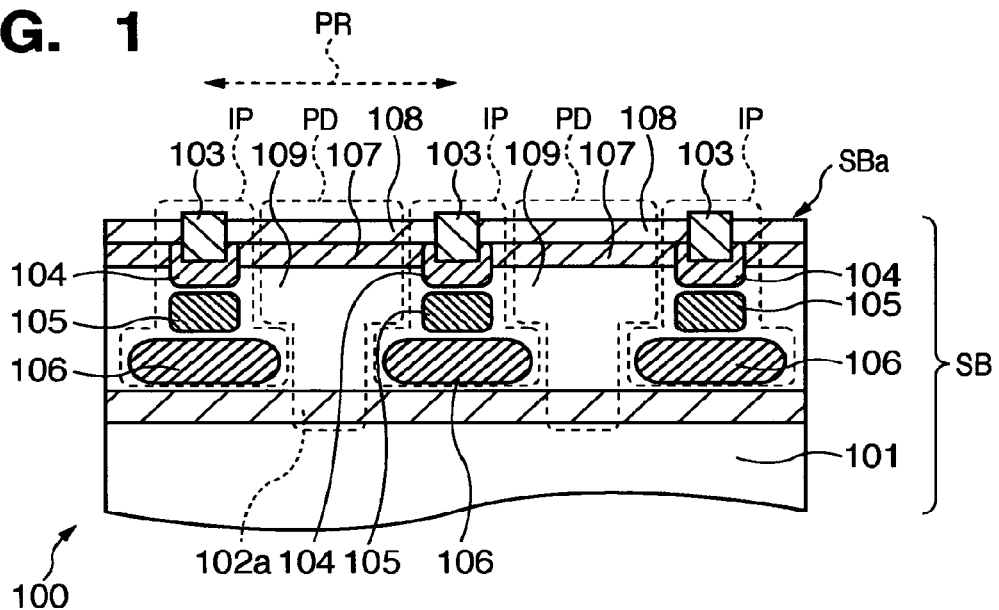
FIG. 1 is a diagram illustrating the cross-sectional structure of a photoelectric conversion apparatus 100 according to an embodiment of the present invention.

A photoelectric conversion apparatus 100 according to an embodiment of the present invention shall be described using FIG. 1. FIG. 1 is a diagram illustrating the cross-sectional structure of the photoelectric conversion apparatus 100 according to an embodiment of the present invention. A pixel region PR, corresponding to a single pixel, is shown in FIG. 1.

The photoelectric conversion apparatus 100 includes multiple photoelectric converting units PD and isolation portions IP.

The multiple photoelectric converting units PD are disposed in a semiconductor substrate SB. The semiconductor substrate SB is formed primarily of, for example, silicon. Although not depicted in FIG. 1, the multiple photoelectric converting units PD are disposed in what is a one-dimensional or two-dimensional array when viewed from above. A ground region 101 and a buried N layer 102 are disposed in the semiconductor substrate SB extending across the entire pixel region PR in the location furthest from a surface SBa. The ground region 101 is a region of the semiconductor substrate SB that has not been implanted with impurities. The ground region 101 contains a second conductivity type (for example, a P-type) impurity. The buried N layer 102 is disposed upon the ground region 101. The buried N layer 102 contains a first conductivity type (for example, an N-type) impurity at a higher concentration than that of the second conductivity type impurity contained in the ground region 101. The second conductivity type is a conductivity type opposite to the first conductivity type. The buried N layer 102 can be formed through, for example, the high-energy implantation of phosphorous.

Each photoelectric converting unit PD produces a charge pair based on light and stores one of the charges (for example, the hole). Each photoelectric converting unit PD is, for example, a photodiode. Each photoelectric converting unit PD contains a charge storage region (second semiconductor region) 107, an effective sensitivity region (third semiconductor region) 109, and a buried region (fourth semiconductor region) 102. 102a indicates a P-N junction boundary between the effective sensitivity region 109 and the buried region 102. A buried photodiode may be implemented by providing a surface region (first semiconductor region) 108 in order to suppress dark current at the insulating film boundary.

The charge storage region 107 is disposed below the surface region 108. The charge storage region 107 contains a second conductivity type (for example, a P-type) impurity at a higher concentration than that of the ground region 101. The charge storage region 107 is formed through, for example, boron ion implantation. When containing a P-type impurity, the charge storage region 107 stores holes.

The surface region 108 contains a first conductivity type (for example, an N-type) impurity at a higher concentration than that of the effective sensitivity region 109. The surface region 108 is formed through, for example, arsenic ion implantation. A photodiode, which is a photoelectric converting unit, becomes a buried photodiode due to the surface region 108, and therefore the generation of dark current caused by a dangling bond at the surface SBa of the semiconductor substrate SB can be suppressed.

The effective sensitivity region 109 is disposed below the charge storage region 107. The effective sensitivity region 109 contains a second conductivity type (for example, a P-type) impurity at a lower concentration than that of the charge storage region 107. While it is possible to form the effective sensitivity region 109 through boron ion implantation, it is also possible to use a region of the semiconductor substrate SB in which impurities have not been implanted as the effective sensitivity region 109.

The boundary region 102a is a region in the buried N layer 102 corresponding to an area disposed below the effective sensitivity region 109.

The isolation portions IP are disposed in the semiconductor substrate SB so as to isolate the multiple photoelectric converting units PD from one another. "Isolation" as used here refers to electrically isolating at least the charge storage regions 107 from each other. It is, however, further preferable for the effective sensitivity regions 109 to be electrically isolated from each other as well.

As opposed to this, the surface regions 108 and buried regions 102 need not be isolated. The isolation portions IP extend between the multiple photoelectric converting units PD in strip form or grid form so as to isolate the multiple photoelectric converting units PD from one another. Each isolation portion IP contains an element isolation portion 103, a first isolation region (fifth semiconductor region) 104, a second isolation region (sixth semiconductor region) 105, and a third isolation region (sixth semiconductor region) 106.

The element isolation portion 103 is disposed upon the first isolation region 104. The element isolation portion 103 is disposed laterally to the surface region 108 in the photoelectric converting unit PD. The element isolation portion 103 is formed of an insulator such as silicon oxide. The element isolation portion 103 may have, for example, an STI (Shallow Trench Isolation) structure, or may have a LOCOS (LOCal Oxidation of Silicon) structure. Alternatively, diffusive isolation may be employed.

The first isolation region 104 is disposed below the element isolation portion 103 so as to cover the base of the element isolation portion 103. The first isolation region 104 is disposed in a position deeper than the surface SBa of the semiconductor substrate SB and extended lateral to at least the charge storage region 107. The first isolation region 104 may be disposed so as to extend to the side of the effective sensitivity region 109. The first isolation region 104 contains a first conductivity type impurity. The impurity contained in the first isolation region 104 has, for example, arsenic, which is an N-type impurity, as its primary component. The first isolation region 104 is formed by, for example, arsenic ion implantation.

The second isolation region 105 is disposed below the first isolation region 104. The second isolation region 105 is disposed lateral to at least the effective sensitivity region 109. The second isolation region 105 may furthermore be disposed lateral to the charge storage region 107. The impurity contained in the second isolation region 105 has, for example, phosphorous, which is an N-type impurity, as its primary component. The second isolation region 105 is formed by, for example, phosphorous ion implantation.

The third isolation region 106 is disposed below the second isolation region 105. The third isolation region 106 is disposed below the first isolation region 104 and lateral to the effective sensitivity region 109. The third isolation region 106 may furthermore be disposed lateral to the charge storage region 107. The impurity contained in the third isolation region 106 has, for example, phosphorous, which is an N-type impurity, as its primary component. The third isolation region 106 is formed by, for example, phosphorous ion implantation.

Here, the mass of the impurity (for example, arsenic) contained in the first isolation region 104 is greater than the mass of the impurity (for example, phosphorous) contained in the second isolation region 105 or the third isolation region 106. Accordingly, the diffusion coefficient of the impurity contained in the first isolation region 104 is lower than the diffusion coefficient of the impurity contained in the second isolation region 105 or the third isolation region 106. As a result, the diffusion of the impurity contained in the first isolation region 104 into the charge storage region 107 can be reduced while also preventing the charge produced in the photoelectric converting unit PD from leaking into an adjacent photoelectric converting unit PD. In other words, a potential barrier for charges can be formed with certainty between adjacent photoelectric converting units and a reduction in the volume of the charge storage region 107 can be suppressed, which makes it possible to suppress a drop in sensitivity of the photoelectric converting unit when there is a reduced distance between adjacent photoelectric converting units.

According to the present embodiment, isolation regions are formed as N-type regions, and different ion types are used in shallow areas and deep areas, respectively. In the implantation profile for arsenic ion implantation, there is a low spread in the lateral direction, and the diffusion coefficient resulting from the heat of the arsenic is low. Accordingly, forming the first isolation region 104 from arsenic makes it possible to more narrowly form the first isolation region. As a result, the charge storage region 107 of the photoelectric converting unit PD can be more widely laid out. This furthermore enables the use of a method that reduces the concentration at the junction area and moderates the electrical field when designing the photoelectric converting unit PD so that an interval is provided in the layout between the charge storage region 107 of the photoelectric converting unit PD and the first isolation region 104. In this case, too, the lateral spread of the first isolation region 104 is low, and thus the impurity concentration at the junction area can be effectively reduced. This limits the electrical field at the junction area, thereby making it possible to realize a sensor with a low dark current and a low occurrence of white defects.

Furthermore, according to experiments performed by the inventors, it was discovered that there is a high incidence of dark current and white defects in the area of a junction between a P-type semiconductor region formed through boron implantation and an N-type semiconductor region formed through phosphorous implantation within a silicon substrate. Conversely, it was discovered that there is a low incidence of dark current and white defects in the area of a junction between a P-type semiconductor region formed through boron implantation and an N-type semiconductor region formed through arsenic implantation. It is thought that the reason for such a difference is that the ion radius of arsenic within the silicon is greater than the ion radius of phosphorus. The ion radius ra of arsenic is only slightly larger than that of silicon. The ra of arsenic is 1.18 Å, resulting in a ratio of 1.00855 relative to silicon. As opposed to this, the ion radius of phosphorous is smaller than that of silicon. The ra of phosphorous is 1.1 Å, resulting in a ratio of 0.940171 relative to silicon. Based on this, it is thought that phosphorous results in grating distortion.

According to the present embodiment, the charge storage region 107 of the photoelectric converting unit PD contains, for example, boron as its impurity, whereas the first isolation region 104 contains arsenic as its impurity. Accordingly, the occurrence of dark current and white defects in the junction area between the charge storage region 107 and the first isolation region 104 can be suppressed.

Meanwhile, in this embodiment, the third isolation region 106 is formed by, for example, phosphorous ion implantation. The effects thereof shall be described hereinafter. In order to obtain a high sensitivity in the photoelectric converting unit PD, and particularly a high sensitivity with respect to incident light of a long wavelength, it is necessary to form the photoelectric converting unit PD to extend deeply. Accordingly, in the present invention, the buried N layer 102 is formed through, for example, the high-energy implantation of phosphorous. This is because the mass of phosphorous is lower than the mass of arsenic, and thus phosphorous penetrates more deeply at the same kinetic energy. If the third isolation region 106 is too shallow when forming the buried N layer 102 deeply, sufficient isolation from the adjacent photoelectric converting unit PD cannot be achieved, resulting in color mixture, blooming, and so on. It is thus necessary to deeply implant the third isolation region 106, and thus forming this region of phosphorous is advantageous in terms of performance, productivity, and cost. While the second isolation region 105 is formed of phosphorous in the present embodiment, note that arsenic can be selected as well.

The kinetic energy for implantation in the structure according to the present embodiment shall be discussed next.

The buried N layer 102 can be formed by implanting phosphorous at a kinetic energy of approximately 500 keV to 10 MeV. In consideration of production costs, it is further desirable to form this layer at a kinetic energy of approximately 3 to 5 MeV. The first isolation region 104 can be formed by implanting arsenic at a kinetic energy of approximately 300 keV to 2 MeV. It is further desirable to form this region at 500 keV to 900 keV. The second isolation region 105 can be formed by implanting phosphorous at a kinetic energy of approximately 500 keV to 3 MeV. It is further desirable to form this region at a kinetic energy of 800 keV to 1.5 MeV. Although the second isolation region 105 is formed of phosphorous in the present embodiment, this region can also be formed of arsenic. The third isolation region 106 can be formed by implanting phosphorous at a kinetic energy of approximately 1 MeV to 9 MeV. It is further desirable to form this region at a kinetic energy of approximately 1 MeV to 2 MeV. The charge storage region 107 of the photoelectric converting unit PD can be formed by implanting boron at a kinetic energy of approximately 50 to 200 keV. Finally, the surface region 108 of the photoelectric converting unit PD can be formed by implanting arsenic at a kinetic energy of approximately 30 to 120 keV.

Next, a manufacturing method for a photoelectric conversion apparatus according to an embodiment of the present invention shall be described using FIGS. 2A to 4C. FIGS. 2A through 4C are cross-sections illustrating steps of a photoelectric conversion apparatus manufacturing method according to an embodiment of the present invention.

Figure 2A:
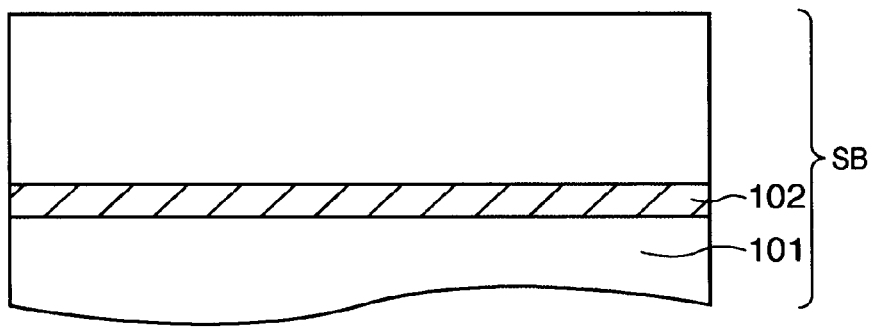
FIGS. 2A and 2B are cross-sections illustrating steps of a photoelectric conversion apparatus manufacturing method according to an embodiment of the present invention.

In the step illustrated in FIG. 2A, the buried N layer 102 is formed by implanting ions of a first conductivity type impurity in the semiconductor substrate SB. The first conductivity type impurity in this step is, for example, phosphorous, which is an N-type impurity.

Figure 2B:
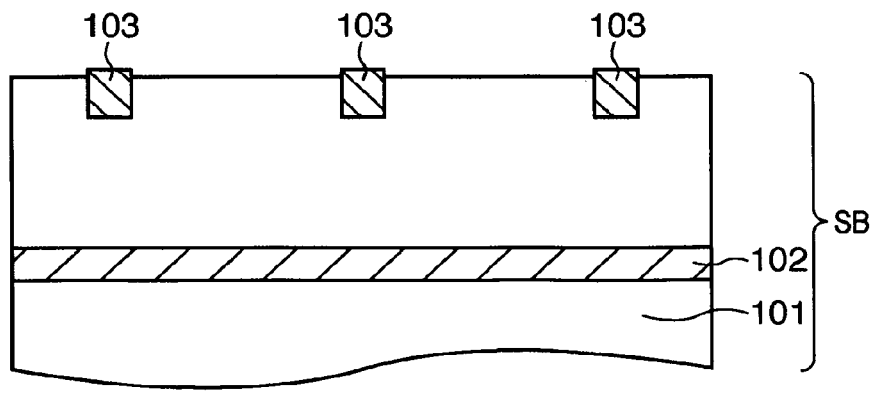

In the step illustrated in FIG. 2B (a first step), an STI element isolation portion 103 is formed by first forming channels in regions in which the multiple photoelectric converting units in the semiconductor substrate SB are to be isolated from one another, and then embedding an insulator in those channels.

Figure 3A:
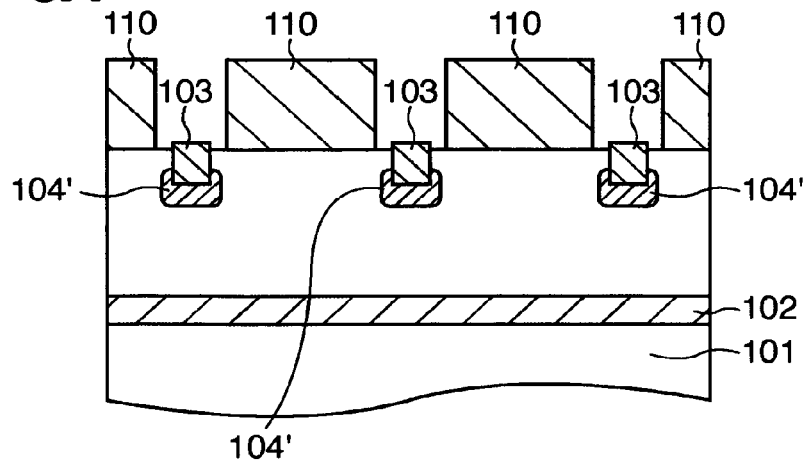
FIGS. 3A through 3C are cross-sections illustrating steps of a photoelectric conversion apparatus manufacturing method according to an embodiment of the present invention.

In the step illustrated in FIG. 3A (a second step), a resist is applied and then patterned through an exposure process, thereby forming a first resist pattern 110 that exposes the element isolation portions. A first isolation region 104' is then formed in the semiconductor substrate SB below the element isolation portion 103 by implanting a first impurity of the first conductivity type in the semiconductor substrate SB using the first resist pattern 110 as a mask. The first impurity of the first conductivity type in this step is, for example, arsenic, which is an N-type impurity.

Figure 3B:
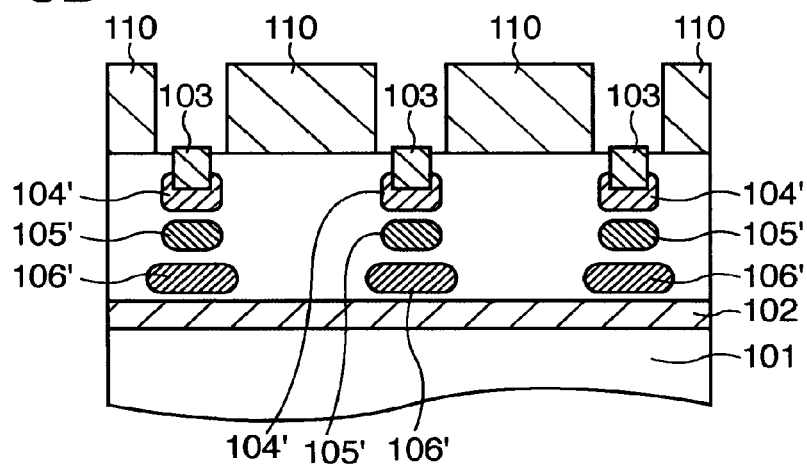

In the step illustrated in FIG. 3B (a third step), a second isolation region 105' is formed in the semiconductor substrate SB below the first isolation region 104' by implanting a second impurity of the first conductivity type in the semiconductor substrate SB using the first resist pattern 110 as a mask. Furthermore, a third isolation region 106' is formed in the semiconductor substrate SB below the first isolation region 104' by implanting the second impurity of the first conductivity type in the semiconductor substrate SB using the first resist pattern 110 as a mask. The second impurity of the first conductivity type in this step is, for example, phosphorous, which is an N-type impurity.

Here, the aforementioned conditions can be used as the conditions for each instance of implantation. Furthermore, in the present embodiment, the first isolation region 104', second isolation region 105', and third isolation region 106' can be formed using the same resist pattern. This enables low-cost manufacture without an increase in the number of processing steps. It also makes it possible to suppress variance in the properties arising in the manufacture due to misalignments.

Figure 3C:
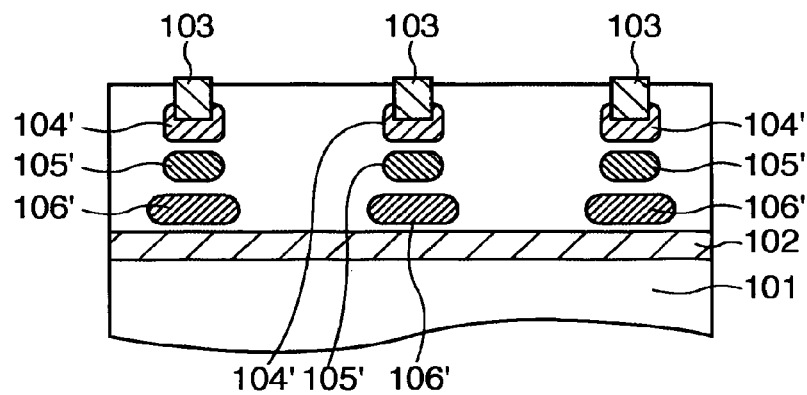

In the step illustrated in FIG. 3C, the first resist pattern 110 is removed.

Figure 4A:
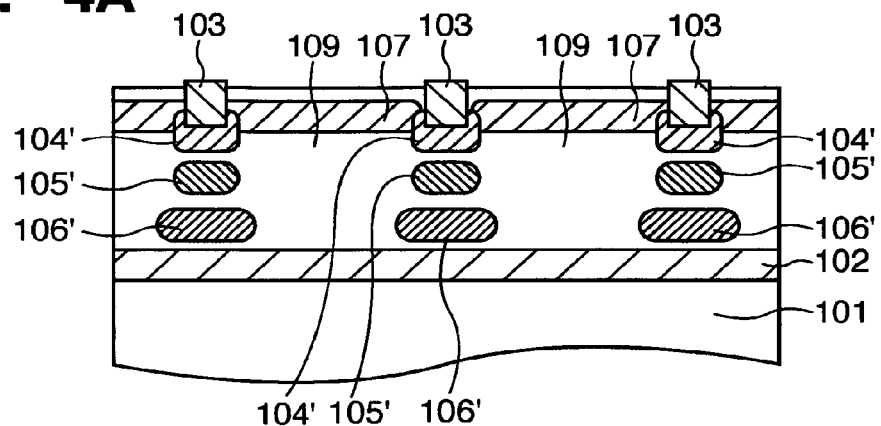
FIGS. 4A through 4C are cross-sections illustrating steps of a photoelectric conversion apparatus manufacturing method according to an embodiment of the present invention.

In the step illustrated in FIG. 4A, a second resist pattern (not shown) is formed by applying a resist and then patterning the resist through an exposure process so as to expose the regions between the multiple isolation portions. The charge storage region 107 of the photoelectric converting unit PD is then formed between the multiple element isolation portions 103 in the semiconductor substrate SB by implanting a second conductivity type impurity in the semiconductor substrate SB using the second resist pattern as a mask. The second conductivity type impurity in this step is, for example, boron, which is a P-type impurity.

Figure 4B:
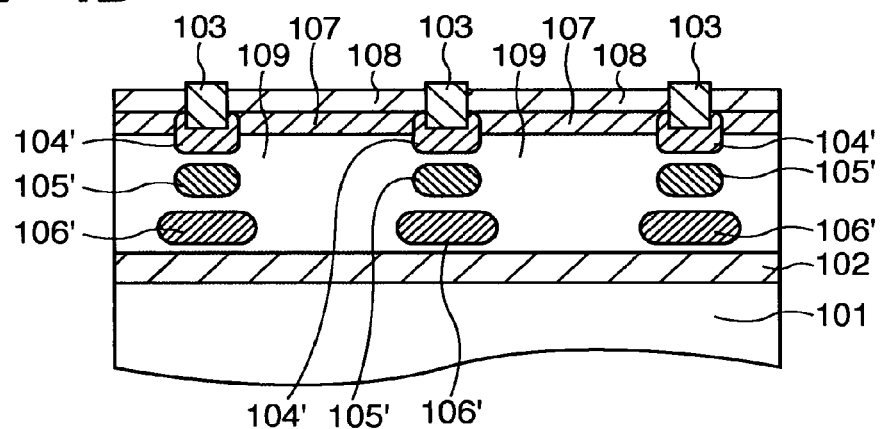

In the step illustrated in FIG. 4B, the surface region 108 of the photoelectric converting unit PD is formed between the multiple element isolation portions 103 in the semiconductor substrate SB by implanting a first conductivity type impurity in the semiconductor substrate SB using the second resist pattern as a mask. The first conductivity type impurity in this step is, for example, arsenic, which is an N-type impurity.

Figure 4C:
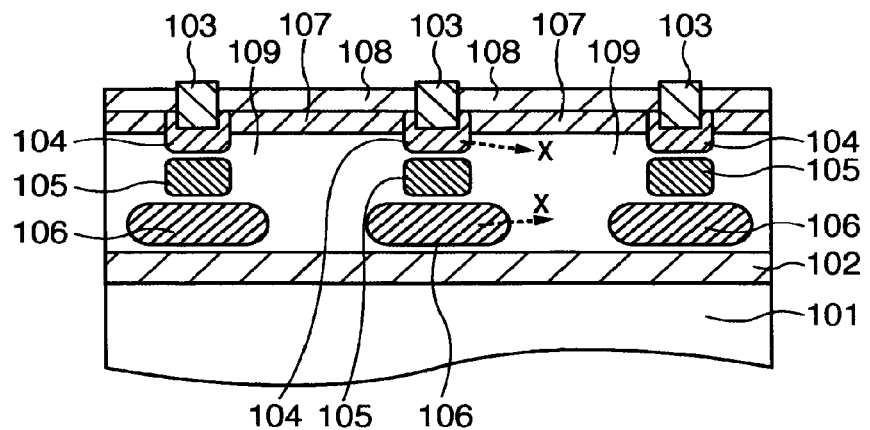

In the step illustrated in FIG. 4C, the first isolation region 104, second isolation region 105, and third isolation region 106 are stabilized through thermal diffusion (heat treatment). When this thermal diffusion is performed, the arsenic contained in the first isolation region 104' has a low diffusion coefficient and thus exhibits little diffusion with respect to the profile immediately following implantation.

Figure 5:
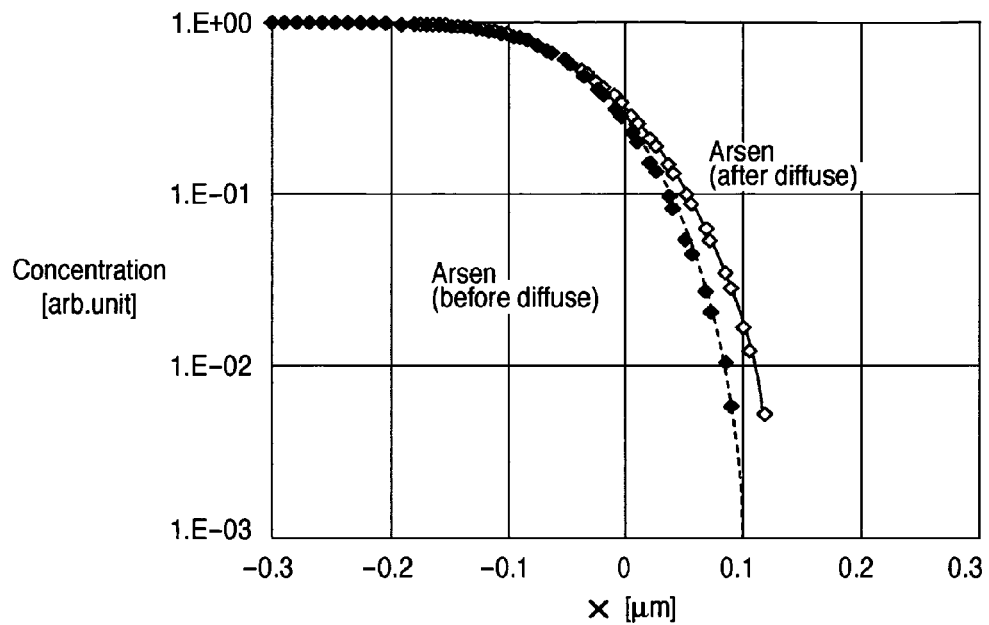
FIG. 5 is a diagram illustrating simulation results for a lateral diffusion profile of arsenic.
Figure 6:
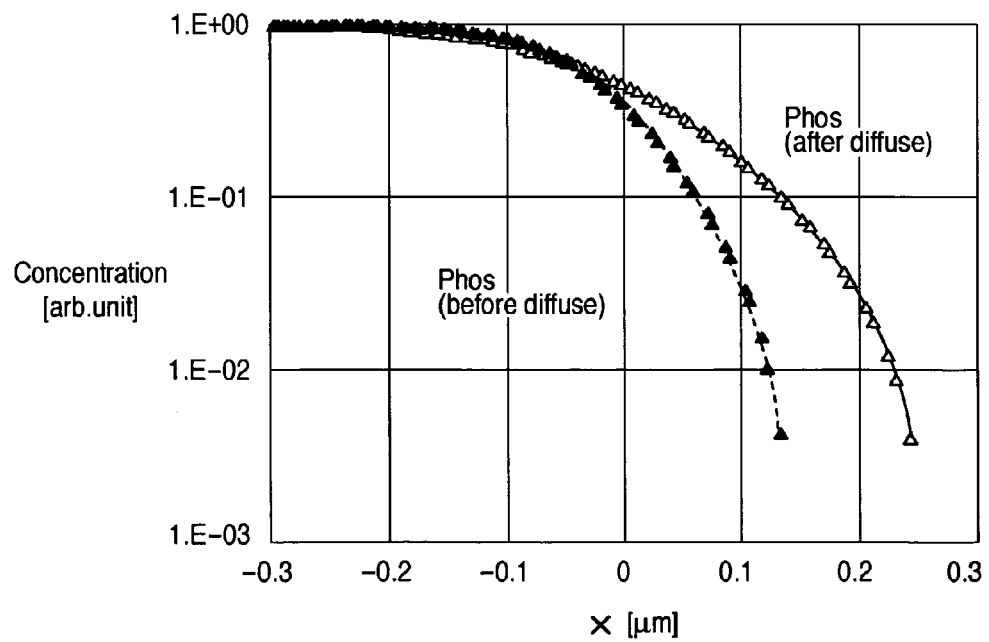
FIG. 6 is a diagram illustrating simulation results for a lateral diffusion profile of phosphorous.

The results of simulations of the influence of thermal diffusion performed at, for example, 900° C. for approximately one hour are illustrated in FIGS. 5 and 6. FIG. 5 is a diagram illustrating the simulation results for a lateral diffusion profile of arsenic. FIG. 6, meanwhile, is a diagram illustrating the simulation results for a lateral diffusion profile of phosphorous. In FIGS. 5 and 6, the vertical axis expresses the degree of concentration, whereas the horizontal axis expresses the distance in the lateral direction from a base location. Furthermore, in FIGS. 5 and 6, the black plot points express the profile prior to thermal diffusion, whereas the white plot points express the profile following thermal diffusion.

As shown in FIG. 6, when phosphorous is used as the impurity contained in the first isolation region 104, the phosphorous diffuses significantly due to the heat of the post-implantation process, exerting pressure on the charge storage region 107 of the photoelectric converting unit PD and thus reducing the size of the charge that can be stored in the charge storage region 107 of the photoelectric converting unit PD. In addition, a highly-concentrated junction is formed between the charge storage region 107 of the photoelectric converting unit PD and the first isolation region 104, causing the electrical field to concentrate and leading to the occurrence of dark current and white defects.

Meanwhile, as can be seen in FIG. 5, when arsenic is used as the impurity contained in the first isolation region 104, the arsenic experiences a low diffusion caused by the heat of the post-implantation process. It is thus difficult for pressure to be exerted on the charge storage region 107 of the photoelectric converting unit PD, and is furthermore difficult for a highly-concentrated junction to be formed between the charge storage region 107 of the photoelectric converting unit PD and the first isolation region 104. Accordingly, a reduction in the size of the charge stored in the charge storage region 107 of the photoelectric converting unit PD can be suppressed, and the electric field can be suppressed from concentrating in the junction area between the charge storage region 107 and the first isolation region 104, making it possible to reduce the occurrence of dark current and white defects.

In the embodiment of the present invention, the widths of the second isolation region 105 and third isolation region 106 can be adjusted by adjusting the length and temperature of the heat treatment applied after the implantation of the first through third isolation regions. A design that suppresses crosstalk from arising between adjacent pixels and the size of charges leaking in the direction of the substrate can thus be implemented by adjusting the heat treatment.

As described thus far, elements have lower diffusion coefficients the greater their masses are, and thus elements with greater masses are desirable in the formation of the first isolation region 104. Moreover, because elements with lower masses penetrate more deeply during ion implantation at equal kinetic energies, it is preferable to use an element with a low mass as the impurity for forming the third isolation region 106. As a result, a pixel with high sensitivity and high saturation power can be implemented while miniaturizing the size of the pixel as well. A pixel that exhibits little dark current and few white defects can also be implemented. It is thus possible to provide a photoelectric conversion apparatus having a wide dynamic range with a high resolution and a high S/N ratio.

Figure 7:
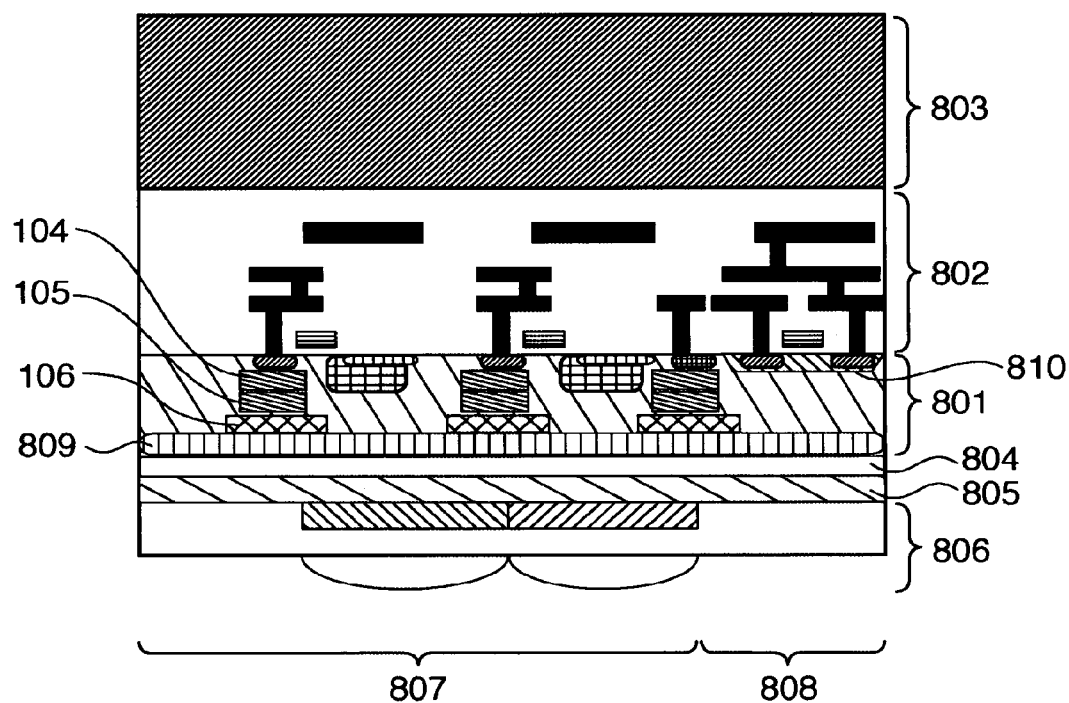
FIG. 7 is a diagram illustrating the cross-sectional structure of a photoelectric conversion apparatus 100 according to another embodiment of the present invention.

FIG. 7 is a cross-section illustrating the photoelectric conversion apparatus 100 according to another embodiment of the present invention. Constituent elements that have the same functions as those of the aforementioned embodiment shall be given the same reference numerals, and detailed descriptions thereof shall be omitted. The difference between the present embodiment and the aforementioned embodiment is the direction in which imaging light enters the apparatus. In the present embodiment, the photoelectric conversion apparatus 100 has what is known as a back-illuminated structure, where the imaging light enters from the downward direction from the surface, or in other words, from the direction opposite to the side on which wiring is provided.

Reference numeral 801 is a substrate in which semiconductor regions such as photoelectric converting units, transistors, and so on are formed (called a "PD formation substrate" hereinafter for the sake of simplicity). A wiring layer 802 is provided upon a first primary surface side (the front surface side) of the PD formation substrate 801. A support substrate 803 is provided above the wiring layer 802, or in other words, on the side opposite to the PD formation substrate 801, primarily to maintain the strength of the substrate. An optical function unit 806 is formed as a necessity upon a protective film 805, which is in turn provided upon an oxide film 804, on a second primary surface side (the rear surface side) of the PD formation substrate 801, or in other words, on the side opposite to the wiring layer 802. The optical function unit 806 contains, for example, a color filter, a microlens, a planar dielectric film, or the like.

In this manner, the present embodiment describes the structure of a solid-state imaging apparatus having what is known as a back-illuminated structure, whereby imaging light enters the apparatus from the side opposite to the side on which the wiring layer is provided, or in other words, from the rear surface side.

The cross-sectional structure in FIG. 7 shows a pixel region 807 and a peripheral circuit region 808. Multiple photoelectric converting units are disposed in the pixel region 807. A peripheral circuit transistor well 810 is disposed in the peripheral circuit region 808, and an active circuit necessary for driving the solid-state imaging apparatus of the present embodiment is formed. The peripheral circuit includes a scanning circuit configured of, for example, a shift register, a decoder, and so on. The peripheral circuit may further include a readout circuit that performs signal processes such as amplification on signals outputted from the photoelectric converting unit.

A high-concentration N-type semiconductor region 809 is disposed at the border of the second primary surface (the rear surface side) of the PD formation substrate 801. The N-type semiconductor region 809 functions to suppress dark current from arising at the border between the PD formation substrate 801 and the oxide film 804. Although the N-type semiconductor region 809 is disposed across almost the entire surface of the PD formation substrate 801 in FIG. 7, it may be disposed on only the pixel region 807 instead.

As in the aforementioned embodiment, an isolation portion IP is provided, and here, the mass of the impurity (for example, arsenic) contained in the first isolation region 104 is greater than the mass of the impurity (for example, phosphorous) contained in the second isolation region 105 or the third isolation region 106. Accordingly, the diffusion coefficient of the impurity contained in the first isolation region 104 is lower than the diffusion coefficient of the impurity contained in the second isolation region 105 or the third isolation region 106. As a result, the diffusion of the impurity contained in the first isolation region 104 into the charge storage region 107 can be reduced while also preventing the charge produced in the photoelectric converting unit from leaking into an adjacent photoelectric converting unit PD. In other words, a potential barrier for charges can be formed with certainty between adjacent photoelectric converting units and a reduction in the volume of the charge storage region 107 can be suppressed, which makes it possible to suppress a drop in sensitivity of the photoelectric converting unit when there is a reduced distance between adjacent photoelectric converting units. This is identical to the aforementioned embodiment.

Figure 8:
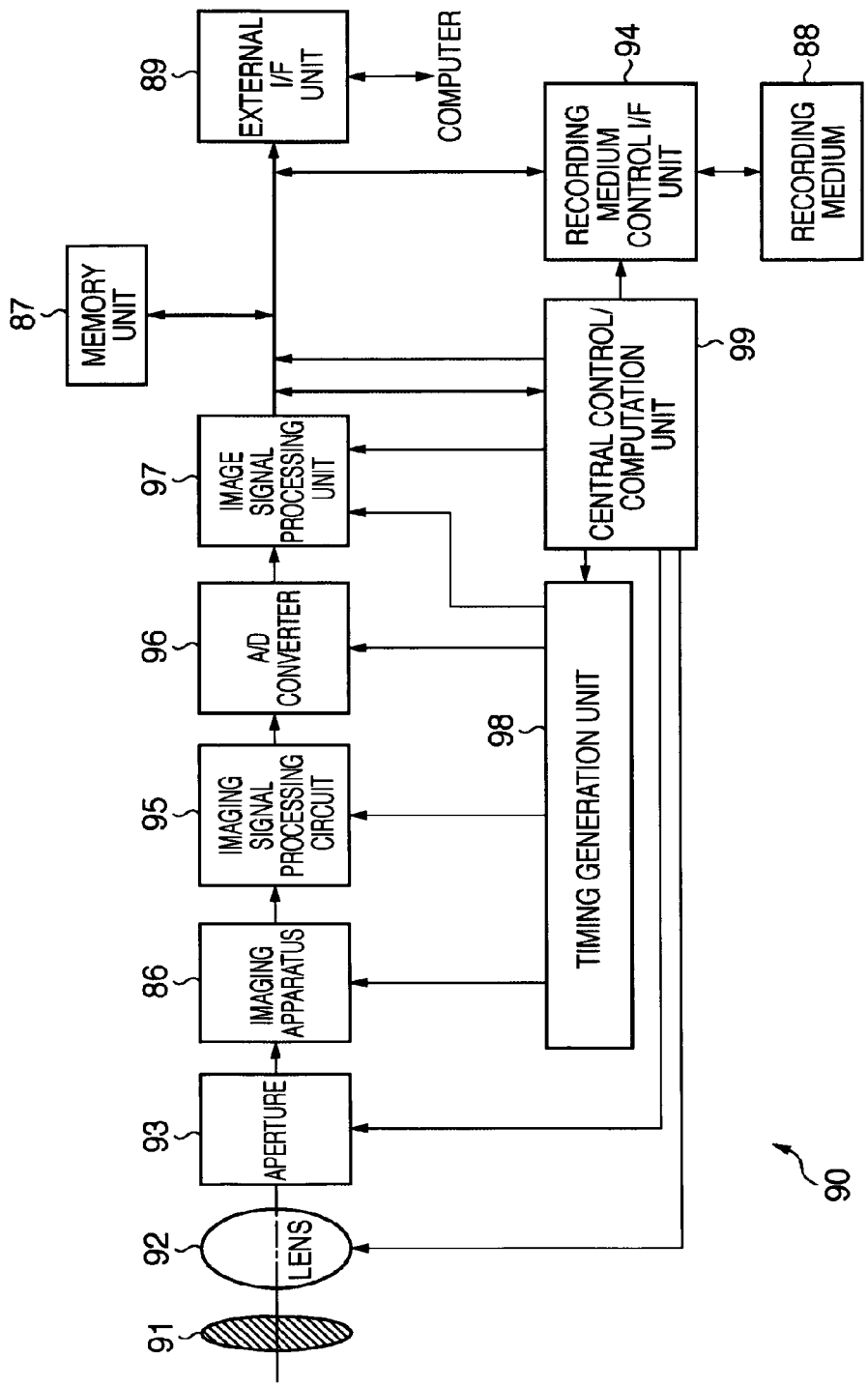
FIG. 8 is a diagram illustrating the configuration of an imaging system in which the photoelectric conversion apparatus according to an embodiment of the present invention has been applied.

Next, FIG. 8 illustrates an example of an imaging system in which the photoelectric conversion apparatus of the present invention has been applied. As shown in FIG. 8, an imaging system 90 includes, as its primary components, an optical system, an imaging apparatus 86, and a signal processing unit. The optical system includes, as its primary components, a shutter 91, a lens 92, and an aperture 93. The imaging apparatus 86 includes the photoelectric conversion apparatus 100. The signal processing unit includes, as its primary components, an imaging signal processing circuit 95, an A/D converter 96, an image signal processing unit 97, a memory unit 87, an external I/F unit 89, a timing generation unit 98, a central control/computation unit 99, a recording medium 88, and a recording medium control I/F unit 94. The signal processing unit does not necessarily need to include the recording medium 88.

The shutter 91 is provided in front of the lens 92 in the optical path, and controls exposures.

The lens 92 refracts incident light, causing an image of a subject to be formed upon an imaging area in the photoelectric conversion apparatus 100 of the imaging apparatus 86.

The aperture 93 is provided between the lens 92 and the photoelectric conversion apparatus 100 in the optical path, and adjusts the amount of light introduced into the photoelectric conversion apparatus 100 after passing through the lens 92.

The photoelectric conversion apparatus 100 of the imaging apparatus 86 converts the image of the subject formed upon the imaging area of the photoelectric conversion apparatus 100 into an image signal. The imaging apparatus 86 reads out this image signal from the photoelectric conversion apparatus 100 and outputs the image signal.

The imaging signal processing circuit 95 is connected to the imaging apparatus 86, and processes the image signal outputted from the imaging apparatus 86.

The A/D converter 96 is connected to the imaging signal processing circuit 95, and converts the processed analog image signal outputted from the imaging signal processing circuit 95 into a digital image signal.

The image signal processing unit 97 is connected to the A/D converter 96, and performs various computational processes such as correction on the digital image signal outputted from the A/D converter 96, thereby generating image data. This image data is then supplied to the memory unit 87, the external I/F unit 89, the central control/computation unit 99, the recording medium control I/F unit 94, and so on.

The memory unit 87 is connected to the image signal processing unit 97, and stores the image data output from the image signal processing unit 97.

The external I/F unit 89 is connected to the image signal processing unit 97. This makes it possible to transfer the image data output from the image signal processing unit 97 to an external device (a personal computer or the like) via the external I/F unit 89.

The timing generation unit 98 is connected to the imaging apparatus 86, the imaging signal processing circuit 95, the A/D converter 96, and the image signal processing unit 97. A timing signal is thus supplied to the imaging apparatus 86, the imaging signal processing circuit 95, the A/D converter 96, and the image signal processing unit 97. The imaging apparatus 86, the imaging signal processing circuit 95, the A/D converter 96, and the image signal processing unit 97 operate in synchronization with the timing signal.

The central control/computation unit 99 is connected to the timing generation unit 98, the image signal processing unit 97, and the recording medium control I/F unit 94, and performs overall control of the timing generation unit 98, the image signal processing unit 97, and the recording medium control I/F unit 94.

The recording medium 88 is connected to the recording medium control I/F unit 94 in a removable state. As a result, image data outputted from the image signal processing unit 97 is recorded into the recording medium 88 via the recording medium control I/F unit 94.

With the configuration described thus far, if a favorable image signal is obtained by the photoelectric conversion apparatus 100, a favorable image (image data) can also be obtained.

While the present invention has been described with reference to an exemplary embodiment, it is to be understood that the invention is not limited to the disclosed exemplary embodiment. The scope of the following claims is to be accorded the broadest interpretation so as to encompass all such modifications and equivalent structures and functions.

This application claims the benefit of Japanese Patent Application Nos. 2009-026696, filed on Feb. 6, 2009 and 2010-010370, filed on Jan. 20, 2010, which are hereby incorporated by reference herein in their entirety.

The invention claimed is:

1. A photoelectric conversion apparatus comprising:
a photoelectric conversion portion disposed in a semiconductor substrate, wherein the photoelectric conversion portion includes:
a first semiconductor region of an N-type;
a second semiconductor region of a P-type, disposed below the first semiconductor region; and
a third semiconductor region of the N-type, disposed below the second semiconductor region; and
an isolation portion disposed in the semiconductor substrate so as to electrically isolate the photoelectric conversion portion, wherein the isolation portion includes:
an insulator including a portion disposed laterally to the first semiconductor region,
a fourth semiconductor region of the N-type, disposed below the portion of the insulator, and
a fifth semiconductor region of the N-type, disposed below the fourth semiconductor region,
wherein the photoelectric conversion portion further includes a sixth semiconductor region of P-type, disposed between the second semiconductor region and the third semiconductor region, the sixth semiconductor region containing P-type impurity at a lower concentration than the second semiconductor region, wherein the fifth semiconductor region is disposed laterally to the sixth semiconductor region and is disposed apart from the second semiconductor region.

2. The photoelectric conversion apparatus according to claim 1, wherein the isolation portion electrically isolates the photoelectric conversion portion from a transistor.

3. The photoelectric conversion apparatus according to claim 1, wherein the apparatus is disposed so that imaging light enters from the rear surface side of the semiconductor substrate.

4. The photoelectric conversion apparatus according to claim 1, wherein the first semiconductor region contains arsenic, the third semiconductor region contains phosphorus, the fourth semiconductor region contains arsenic, and the fifth semiconductor region contains phosphorus.

5. An imaging system comprising:
a photoelectric conversion apparatus;
an optical system that forms an image upon an imaging area of the photoelectric conversion apparatus; and
a signal processing unit that generates image data by processing a signal outputted from the photoelectric conversion apparatus,
wherein the photoelectric conversion apparatus includes:
a photoelectric conversion portion disposed in a semiconductor substrate, wherein the photoelectric conversion portion includes:
a first semiconductor region of an N-type,
a second semiconductor region of a P-type, disposed below the first semiconductor region, and
a third semiconductor region of the N-type, disposed below the second semiconductor region, and
an isolation portion disposed in the semiconductor substrate so as to electrically isolate the photoelectric conversion portion, wherein the isolation portion includes:
an insulator including a portion disposed laterally to the first semiconductor region,
a fourth semiconductor region of the N-type, disposed below the portion of the insulator film, and
a fifth semiconductor region of the N-type, disposed below the fourth semiconductor region,
wherein the photoelectric conversion portion further includes a sixth semiconductor region of P-type, disposed between the second semiconductor region and the third semiconductor region, the sixth semiconductor region containing P-type impurity at a lower concentration than the second semiconductor region, and
wherein the fifth semiconductor region is disposed laterally to the sixth semiconductor region and is disposed apart from the second semiconductor region.

6. The imaging system according to claim 5, wherein the first semiconductor region contains arsenic, the third semiconductor region contains phosphorus, the fourth semiconductor region contains arsenic, and the fifth semiconductor region contains phosphorus.

* * * * *